United States Patent
Song et al.

(10) Patent No.: US 11,387,311 B2
(45) Date of Patent: Jul. 12, 2022

(54) DISPLAY DEVICE FOR REDUCING OR PREVENTING CROSSTALK

(71) Applicant: Samsung Display Co., Ltd., Yongin-si (KR)

(72) Inventors: Hwayoung Song, Yongin-si (KR); Jihyun Ka, Yongin-si (KR); Jongseok Woo, Yongin-si (KR); Wonse Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 48 days.

(21) Appl. No.: 16/985,681

(22) Filed: Aug. 5, 2020

(65) Prior Publication Data

US 2021/0074797 A1 Mar. 11, 2021

(30) Foreign Application Priority Data

Sep. 11, 2019 (KR) .......................... 10-2019-0113017

(51) Int. Cl.
*H01L 29/08* (2006.01)
*H01L 27/32* (2006.01)

(52) U.S. Cl.
CPC ...... *H01L 27/3276* (2013.01); *H01L 27/3262* (2013.01); *H01L 27/3265* (2013.01)

(58) Field of Classification Search
CPC ............. H01L 27/3276; H01L 27/3262; H01L 27/3265
USPC .......................................................... 257/40
See application file for complete search history.

(56) References Cited

U.S. PATENT DOCUMENTS

| | | | |
|---|---|---|---|
| 6,946,791 B2 | 9/2005 | Choi et al. | |
| 9,691,837 B2 | 6/2017 | Kim et al. | |
| 9,954,047 B2 | 4/2018 | Kim et al. | |
| 2015/0221705 A1* | 8/2015 | Amano | H01L 27/127 257/72 |
| 2016/0293889 A1* | 10/2016 | Nakamura | H01L 51/5253 |
| 2018/0151660 A1* | 5/2018 | Kim | H01L 27/3262 |
| 2019/0088732 A1 | 3/2019 | Jung et al. | |

FOREIGN PATENT DOCUMENTS

| | | |
|---|---|---|
| KR | 10-0895313 B1 | 5/2009 |
| KR | 10-0948623 B1 | 3/2010 |
| KR | 10-2016-0058330 A | 5/2016 |
| KR | 10-2017-0124679 A | 11/2017 |
| KR | 10-2019-0032934 A | 3/2019 |

* cited by examiner

*Primary Examiner* — Phuc T Dang
(74) *Attorney, Agent, or Firm* — Lewis Roca Rothgerber Christie LLP

(57) ABSTRACT

A display device having an improved reliability includes a substrate including a display area in which a display element is arranged, a first conductive layer extending in a first direction on a plane, located in the display area, and including a protrusion protruding in a second direction crossing the first direction, a first insulating layer on the first conductive layer, a second conductive layer extending in the first direction on a plane, located on the first insulating layer, and defining a groove overlapping the protrusion of the first conductive layer, a second insulating layer on the second conductive layer, and a third conductive layer extending in the second direction on a plane, located on the second insulating layer, and overlapping the protrusion of the first conductive layer.

20 Claims, 12 Drawing Sheets

DISPLAY DEVICE FOR REDUCING OR PREVENTING CROSSTALK

CROSS-REFERENCE TO RELATED APPLICATION

This application claims priority to, and the benefit of, Korean Patent Application No. 10-2019-0113017, filed on Sep. 11, 2019, in the Korean Intellectual Property Office, the disclosure of which is incorporated herein in its entirety by reference.

BACKGROUND

1. Field

One or more embodiments relate to a display device, and more particularly, to a display device having an improved reliability.

2. Description of Related Art

Among display devices, an organic light-emitting display device has a wide viewing angle, excellent contrast, and fast response speeds. Therefore, the organic light-emitting display device is heavily researched as a next-generation display device.

The organic light-emitting display device includes display elements, and a driving circuit for controlling an electric signal applied to the display elements. The driving circuit includes a thin film transistor, a storage capacitor, and a plurality of wirings.

An organic light-emitting display device may have high resolution, and research on high-speed driving for a high-resolution organic light-emitting display device is in active progress.

SUMMARY

However, in a display device according to a related art, effects due to crosstalk may be perceptible due to a capacitance formed between wirings during a high-speed operation.

One or more embodiments disclosed herein include a display device in which crosstalk viewed during a high-speed operation is reduced, and which has improved product reliability. However, it should be understood that embodiments described herein should be considered in a descriptive sense only, and not for limitation of the disclosure.

Additional aspects will be set forth in part in the description that follows and, in part, will be apparent from the description, or may be learned by practice of the presented embodiments of the disclosure.

According to one or more embodiments, a display device includes a substrate including a display area in which a display element is arranged, a first conductive layer extending in a first direction on a plane, located in the display area, and including a protrusion protruding in a second direction crossing the first direction, a first insulating layer on the first conductive layer, a second conductive layer extending in the first direction on a plane, located on the first insulating layer, and defining a groove overlapping the protrusion of the first conductive layer, a second insulating layer on the second conductive layer, and a third conductive layer extending in the second direction on a plane, located on the second insulating layer, and overlapping the protrusion of the first conductive layer.

The protrusion of the first conductive layer may be apart from a first edge of the second conductive layer partially defining the groove of the second conductive layer in the first direction.

The protrusion of the first conductive layer may be apart from a second edge of the second conductive layer partially defining the groove of the second conductive layer in the second direction.

A width of the protrusion of the first conductive layer in the first direction may be greater than a width of the groove of the second conductive layer in the first direction.

The protrusion of the first conductive layer may overlap at least a portion of the second conductive layer in the first direction.

A length of the protrusion of the first conductive layer in the second direction may be greater than a length of the groove of the second conductive layer in the second direction.

The protrusion of the first conductive layer may overlap at least a portion of the second conductive layer in the second direction.

The third conductive layer may overlap at least a portion of the second conductive layer.

The display device may further include a first thin film transistor in the display area, the first thin film transistor including a first semiconductor layer, and a first gate electrode insulated from the first semiconductor layer.

The first gate electrode may be on the same layer as the first conductive layer.

The display device may further include a storage capacitor including a bottom electrode, and a top electrode over the bottom electrode, wherein the bottom electrode includes the same material as the first gate electrode, and wherein the top electrode includes the same material as the second conductive layer.

The display device may further include a driving voltage line on the same layer as the third conductive layer, wherein the driving voltage line is connected to the second conductive layer through a first contact hole.

The display device may further include a second thin film transistor in the display area, the second thin film transistor including a second semiconductor layer, and a second gate electrode insulated from the second semiconductor layer.

The display device may further include a connection metal on the second insulating layer, wherein the connection metal is on the same layer as the third conductive layer.

According to one or more embodiments, a display device includes a substrate including a display area in which a display element is arranged, an emission control line extending in a first direction on a plane, located in the display area, and including a protrusion protruding in a second direction crossing the first direction, a first insulating layer on the emission control line, an electrode voltage line extending in the first direction on a plane, located on the first insulating layer, and defining a groove that is apart from the protrusion of the emission control line in the first direction and in the second direction, a data line extending in the second direction on a plane, located on the electrode voltage line, and shielded by the protrusion of the emission control line, and a second insulating layer between the electrode voltage line and the data line.

The data line may overlap at least a portion of the electrode voltage line.

The display device may further include a first thin film transistor in the display area, the first thin film transistor including a first semiconductor layer, and a first gate electrode insulated from the first semiconductor layer.

The first gate electrode may be on the same layer as the emission control line.

The display device may further include a storage capacitor including a bottom electrode, and a top electrode over the bottom electrode, wherein the bottom electrode includes the same material as the first gate electrode, and wherein the top electrode includes the same material as the electrode voltage line.

The display device may further include a second thin film transistor in the display area, the second thin film transistor including a second semiconductor layer, and a second gate electrode insulated from the second semiconductor layer.

The above and other aspects of embodiments of the disclosure will be more apparent from the following description, the accompanying drawings, and claims.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Figure 1:
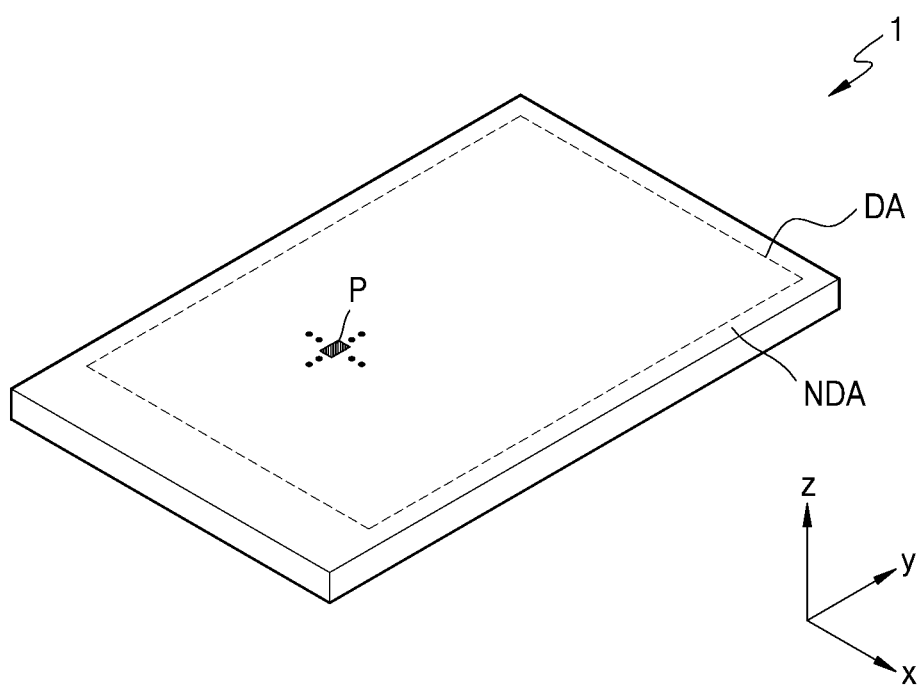
FIG. 1 is a perspective view of a display device according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present embodiments are described in detail with reference to the accompanying drawings. In the drawings, the same reference numerals are given to the same or corresponding elements, and repeated description thereof is omitted.

It will be understood that although the terms "first," "second," etc. may be used herein to describe various components, these components should not be limited by these terms. These components are only used to distinguish one component from another. As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a perspective view of a display device 1 according to one or more embodiments.

Referring to FIG. 1, the display device 1 includes a display area DA on which an image is displayed, and a non-display area NDA on which no image is displayed. The display device 1 may display an image by using light emitted from a plurality of pixels P arranged in the display area DA. The non-display area NDA is an area on which an image is not displayed.

Hereinafter, though the display device 1 is described as an organic light-emitting display device as an example, a display device according to the present disclosure is not limited thereto. In other embodiments, the display device 1 may vary, and may be, for example, an inorganic light-emitting display and/or a quantum dot light-emitting display. For example, an emission layer of a display element of the display device 1 may include an organic material, an inorganic material, quantum dots, an organic material and quantum dots, or an inorganic material and quantum dots.

Though FIG. 1 shows the display device 1 including a flat display surface, other embodiments are not limited thereto. In one or more embodiments, the display device 1 may include a three-dimensional display surface or a curved display surface.

In the case where the display device 1 includes a three-dimensional display surface, the display device 1 may include a plurality of display areas each indicating different directions, for example, the display device 1 may include a polyprism-type display surface. In one or more embodiments, in the case where the display device 1 includes a curved display surface, the display device 1 may be implemented as various types, such as flexible, foldable, and rollable display devices.

Also, in other embodiments, FIG. 1 shows the display device 1 applicable to a mobile phone terminal. In some embodiments, electronic modules, a camera module, a power module, etc. mounted on a mainboard are arranged on a bracket/case together with the display device 1 to constitute a mobile phone terminal. The display device 1 may also be applicable to large-scale electronic devices, such as televisions, monitors, and medium and small-scale electronic devices such as tablet devices, navigation devices for an automobile, game consoles, and smartwatches.

Though FIG. 1 shows the case where the display area DA of the display device 1 is a quadrangle, a shape of the display area DA may be a circle, an ellipse, or a polygon, such as a triangle or a pentagon, in other embodiments.

Figure 2:
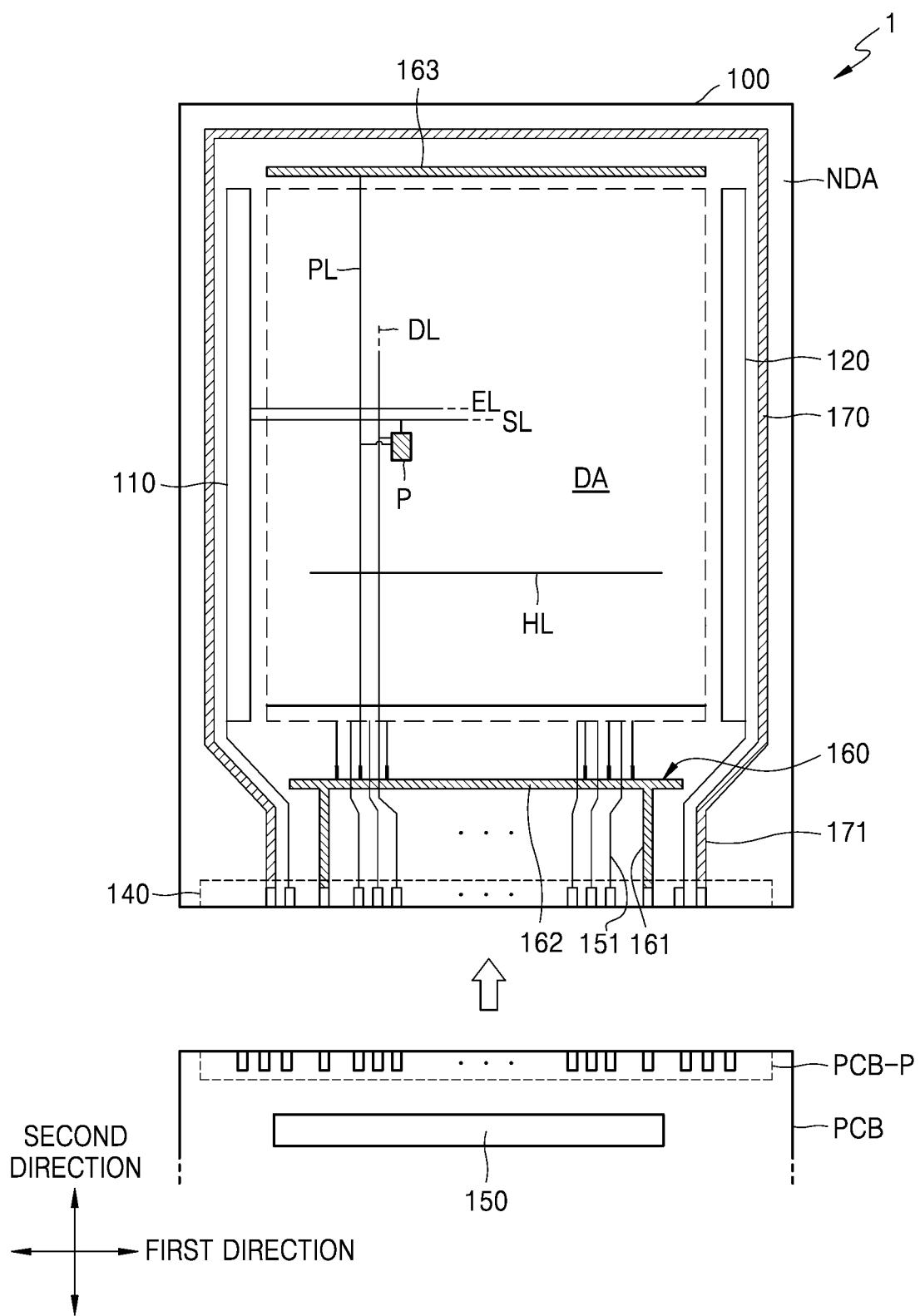
FIG. 2 is a plan view of a display device according to one or more embodiments.

FIG. 2 is a plan view of the display device 1 according to one or more embodiments.

Referring to FIG. 2, the display device 1 includes a plurality of pixels P arranged in the display area DA. Each of the plurality of pixels P may include a display element, such as an organic light-emitting diode OLED. Each pixel P may emit, for example, red, green, blue, or white light, from an organic light-emitting diode OLED. In some embodiments, the display area DA may be protected from external air or moisture by being covered by a thin-film encapsulation layer.

Each pixel P may be electrically connected to outer circuits arranged in the non-display area NDA. A first scan driving circuit 110, a second scan driving circuit 120, a pad unit 140, a data driving circuit 150, a first power supply line 160, and a second power supply line 170 may be arranged in the non-display area NDA.

The first scan driving circuit 110 may supply a scan signal to each pixel P through a corresponding scan line SL. The first scan driving circuit 110 may provide an emission control signal to each pixel P through a corresponding emission control line EL. The second scan driving circuit 120 may be parallel to the first scan driving circuit 110 with the display area DA therebetween. Some of the pixels P arranged in the display area DA may be electrically connected to the first scan driving circuit 110, and the rest of the pixels P may be connected to the second scan driving circuit 120. In one or more embodiments, an emission driving circuit may be additionally and separately provided to provide an emission control signal.

The pad unit 140 may be arranged on one side of the substrate 100. The pad unit 140 may be exposed and electrically connected to a printed circuit board PCB by not being covered by an insulating layer. A pad unit PCB-P of the printed circuit board PCB may be electrically connected to the pad unit 140 of the display device 1. In some embodiments, the printed circuit board PCB transfers a signal of a controller, or transfers power, to the display device 1.

A control signal generated by the controller may be transferred to the first scan driving circuit 110 and to the second scan driving circuit 120 through the printed circuit board PCB. The controller may respectively provide a first power voltage ELVDD (see FIG. 3) and a second power voltage ELVSS (see FIG. 3) (which may be supplied via a common electrode) to the first power supply line 160 and to the second power supply line 170 through a first connection line 161 and a second connection line 171. The first power voltage ELVDD may be provided to each pixel P through a driving voltage line PL connected to the first power supply line 160, and the second power voltage ELVSS may be provided to an opposite electrode of each pixel P connected to the second power supply line 170.

The driving voltage line PL extends in a second direction perpendicularly intersecting with, or crossing, a first direction, and an electrode voltage line HL connected to the driving voltage line PL through a contact hole extends in the first direction. The electrode voltage line HL extending in the first direction and the driving voltage line PL extending in the second direction may constitute a mesh structure.

The data driving circuit 150 is electrically connected to a data line DL. A data signal of the data driving circuit 150 may be provided to each pixel P through a connection line 151 connected to the pad unit 140 and through the data line DL connected to the connection line 151. Though it is shown in FIG. 2 that the data driving circuit 150 is arranged on the printed circuit board PCB, the data driving circuit 150 may be arranged on the substrate 100 in other embodiments. For example, the data driving circuit 150 may be arranged between the pad unit 140 and the first power supply line 160.

The first power supply line 160 may include a first sub-line 162 and a second sub-line 163 that are parallel to each other with the display area DA therebetween, and that extend in the first direction. The second power supply line 170 may have a loop shape having one open side, and may partially surround the display area DA.

Figure 3:
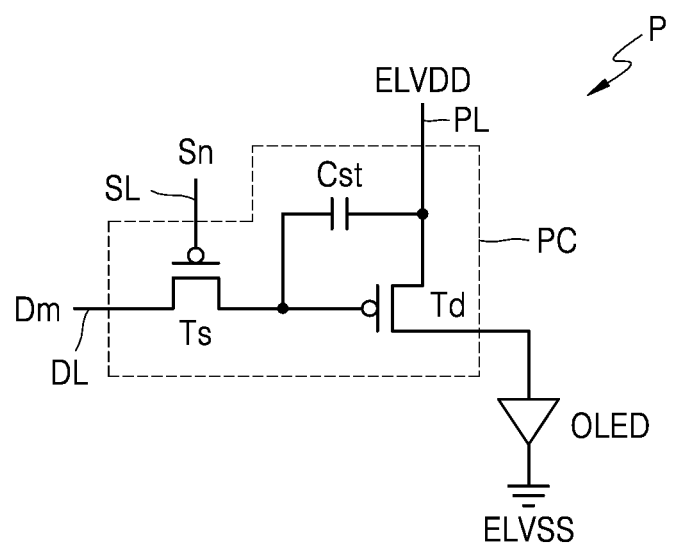
FIGS. 3 and 4 are equivalent circuit diagrams of a pixel that may be included in a display device according to one or more embodiments.
Figure 4:
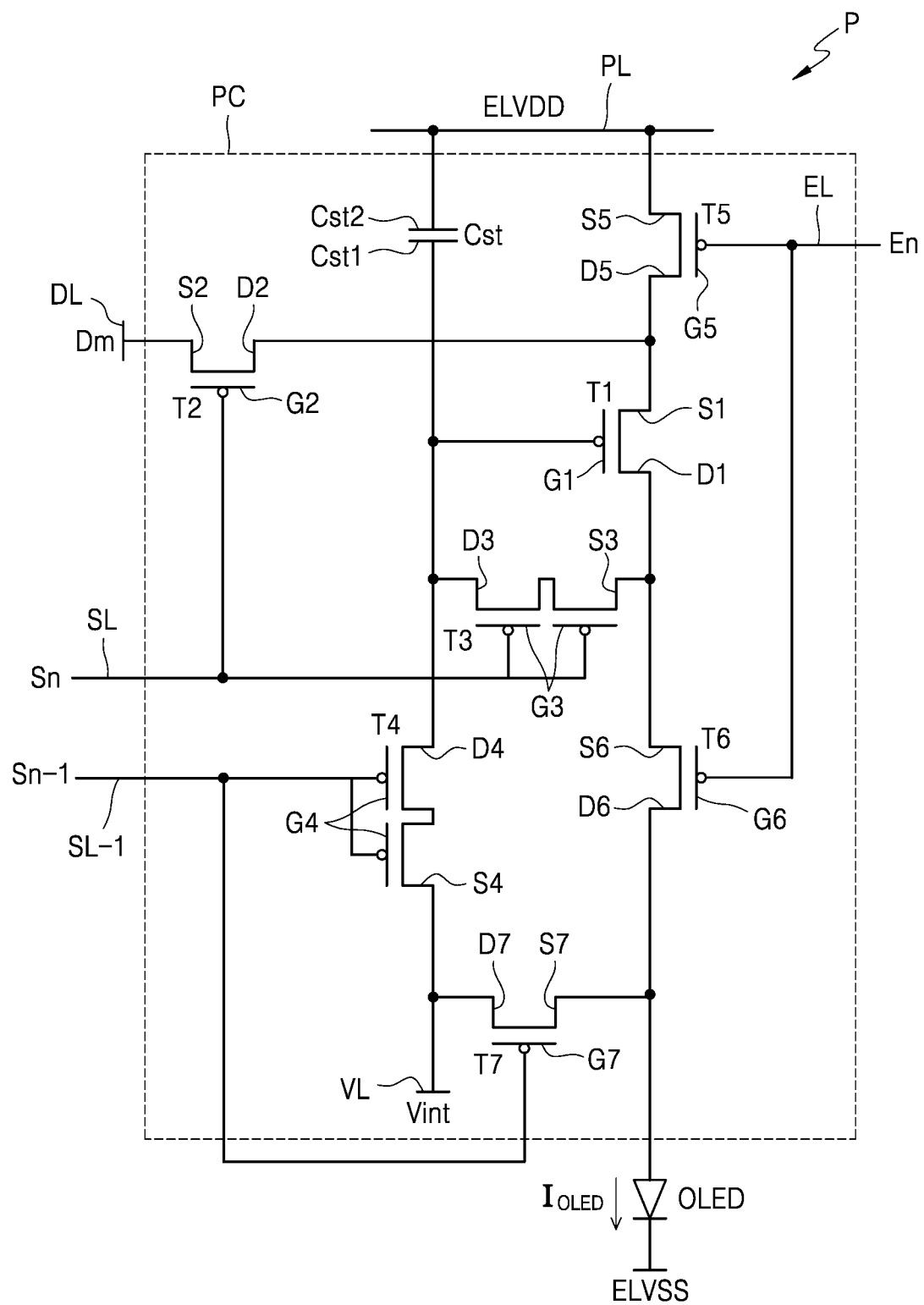

FIGS. 3 and 4 are equivalent circuit diagrams of a pixel that may be included in the display device 1 according to one or more embodiments.

Referring to FIG. 3, each pixel P includes a pixel circuit PC, and an organic light-emitting diode OLED connected to the pixel circuit PC, the pixel circuit PC being connected to a scan line SL and a data line DL.

The pixel circuit PC includes a driving thin film transistor Td, a switching thin film transistor Ts, and a storage capacitor Cst. The switching thin film transistor Ts is connected to the scan line SL and the data line DL, and transfers a data signal Dm input through the data line DL to the driving thin film transistor Td in response to a scan signal Sn input through the scan line SL.

The storage capacitor Cst is connected to the switching thin film transistor Ts and the driving voltage line PL, and stores a voltage corresponding to a difference between a voltage transferred from the switching thin film transistor Ts and the first power voltage ELVDD supplied to the driving voltage line PL.

The driving thin film transistor Td is connected to the driving voltage line PL and the storage capacitor Cst, and may control a driving current flowing through the organic light-emitting diode OLED from the driving voltage line PL in response to the voltage stored in the storage capacitor Cst. The organic light-emitting diode OLED may emit light having a brightness by using the driving current (e.g., a predetermined brightness corresponding to the driving current).

Though it is shown in FIG. 3 that the pixel circuit PC includes two thin film transistors and one storage capacitor, the present disclosure is not limited thereto. For example, as shown in FIG. 4, the pixel circuit PC may include seven thin film transistors and one storage capacitor. Though it is shown in FIG. 4 that the pixel circuit PC includes one storage capacitor, the pixel circuit PC may include two or more storage capacitors in other embodiments.

Referring to FIG. 4, a pixel P includes the pixel circuit PC, and the organic light-emitting diode OLED connected to the pixel circuit PC. The pixel circuit PC may include a plurality of thin film transistors and a storage capacitor. The thin film transistors and the storage capacitor may be connected to signal lines SL, SL−1, EL, and DL, an initialization voltage line VL, and the driving voltage line PL.

Though it is shown in FIG. 4 that the pixel P is connected to the signal lines SL, SL−1, EL, and DL, the initialization voltage line VL, and the driving voltage line PL, other embodiments are not limited thereto. In one or more embodiments, at least one of the signal lines SL, SL−1, EL, and DL, the initialization voltage line VL, and the driving voltage line PL may be shared by neighboring pixels.

The signal lines include the scan line SL, a previous scan line SL−1, the emission control line EL, and the data line DL, the scan line SL transferring a scan signal Sn, the previous scan line SL−1 transferring a previous scan signal Sn−1 to a first initialization thin film transistor T4 and to a second initialization thin film transistor T7, the emission control line EL transferring an emission control signal En to an operation control thin film transistor T5 and to an emission control thin film transistor T6, and the data line DL crossing with the scan line SL and transferring a data signal Dm. The driving voltage line PL transfers the driving voltage ELVDD to a driving thin film transistor T1, and the initialization voltage line VL transfers an initialization voltage Vint for initializing the driving thin film transistor T1 and a pixel electrode of the organic light-emitting diode OLED.

A driving gate electrode G1 of the driving thin film transistor T1 is connected to a bottom electrode Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to a pixel electrode 210 (see FIG. 6) of the organic light-emitting diode OLED through the emission control thin film transistor T6. The driving thin film transistor T1 receives a data signal Dm depending on a switching operation of a switching thin film transistor T2, and supplies a driving current IDLED to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and is also connected to the driving voltage line PL through the operation control thin film transistor T5. The switching thin film transistor T2 is turned on in response to a scan signal Sn transferred through the scan line SL, and performs a switching operation for transferring a data signal Dm transferred through the data line DL to the driving source electrode S1 of the driving thin film transistor T1.

A compensation gate electrode G3 of a compensation thin film transistor T3 is connected to the scan line SL, a compensation source electrode S3 of the compensation thin film transistor T3 is connected to the driving drain electrode D1 of the driving thin film transistor T1 and is also connected to the pixel electrode of the organic light-emitting diode OLED through the emission control thin film transistor T6, and a compensation drain electrode D3 of the compensation thin film transistor T3 is connected to the bottom electrode Cst1 of the storage capacitor Cst, to a first initialization drain electrode D4 of the first initialization thin film transistor T4, and to the driving gate electrode G1 of the driving thin film transistor T1. The compensation thin film transistor T3 is turned on in response to a scan signal Sn transferred through the scan line SL, and diode-connects the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL−1, a first initialization source electrode S4 of the first initialization thin film transistor T4 is connected to a second initialization drain electrode D7 of the second initialization thin film transistor T7 and to the initialization voltage line VL, and a first initialization drain electrode D4 of the first initialization thin film transistor T4 is connected to the bottom electrode Cst1 of the storage capacitor Cst, to the compensation drain electrode D3 of the compensation thin film transistor T3, and to the driving gate electrode G1 of the driving thin film transistor T1. The first initialization thin film transistor T4 is turned on in response to a previous scan signal Sn−1 transferred through the previous scan line SL−1, and performs an initialization operation of transferring an initialization voltage Vint to the driving gate electrode G1 of the driving thin film transistor T1, thereby initializing a voltage of the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and to the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and to the compensation source electrode S3 of the compensation thin film transistor T3, and an emission control drain electrode D6 of the emission control thin film transistor T6 is connected to the second initialization source electrode S7 of the second initialization thin film transistor T7 and to the pixel electrode of the organic light-emitting diode OLED.

The operation control thin film transistor T5 and the emission control thin film transistor T6 are concurrently or substantially simultaneously turned on in response to an emission control signal En transferred through the emission control line EL to allow the driving voltage ELVDD to be transferred to the organic light-emitting diode OLED, and thus to allow the driving current IDLED to flow through the organic light-emitting diode OLED.

A second initialization gate electrode G7 of the second initialization thin film transistor T7 is connected to the previous scan line SL−1, the second initialization source electrode S7 of the second initialization thin film transistor T7 is connected to the emission control drain electrode D6 of the emission control thin film transistor T6 and to the pixel electrode of the organic light-emitting diode OLED, and the second initialization drain electrode D7 of the second initialization thin film transistor T7 is connected to the first initialization source electrode S4 of the first initialization thin film transistor T4 and to the initialization voltage line VL. The second initialization thin film transistor T7 is turned on in response to a previous scan signal Sn−1 transferred through the previous scan line SL−1, and initializes the pixel electrode 210 of the organic light-emitting diode OLED.

Though FIG. 4 shows the case where the first initialization thin film transistor T4 and the second initialization thin film transistor T7 are connected to the previous scan line SL−1, other embodiments are not limited thereto. In one or more embodiments, the first initialization thin film transistor T4 may be connected to the previous scan line SL−1 and driven in response to a previous scan signal Sn−1, and the second initialization thin film transistor T7 may be connected to a separate signal line (for example, the next scan line) and driven in response to a signal transferred through the separate signal line.

A top electrode Cst2 of the storage capacitor Cst is connected to the driving voltage line PL, and an opposite electrode 230 (see FIG. 6) of the organic light-emitting diode OLED is connected to the common voltage ELVSS. Therefore, the organic light-emitting diode OLED may receive the driving current IDLED from the driving thin film transistor T1, and may emit light to thereby display an image.

Though it is shown in FIG. 4 that the compensation thin film transistor T3 and the first initialization thin film transistor T4 each have a dual gate electrode, the compensation thin film transistor T3 and the first initialization thin film transistor T4 each may have one gate electrode in other embodiments.

Figure 5:
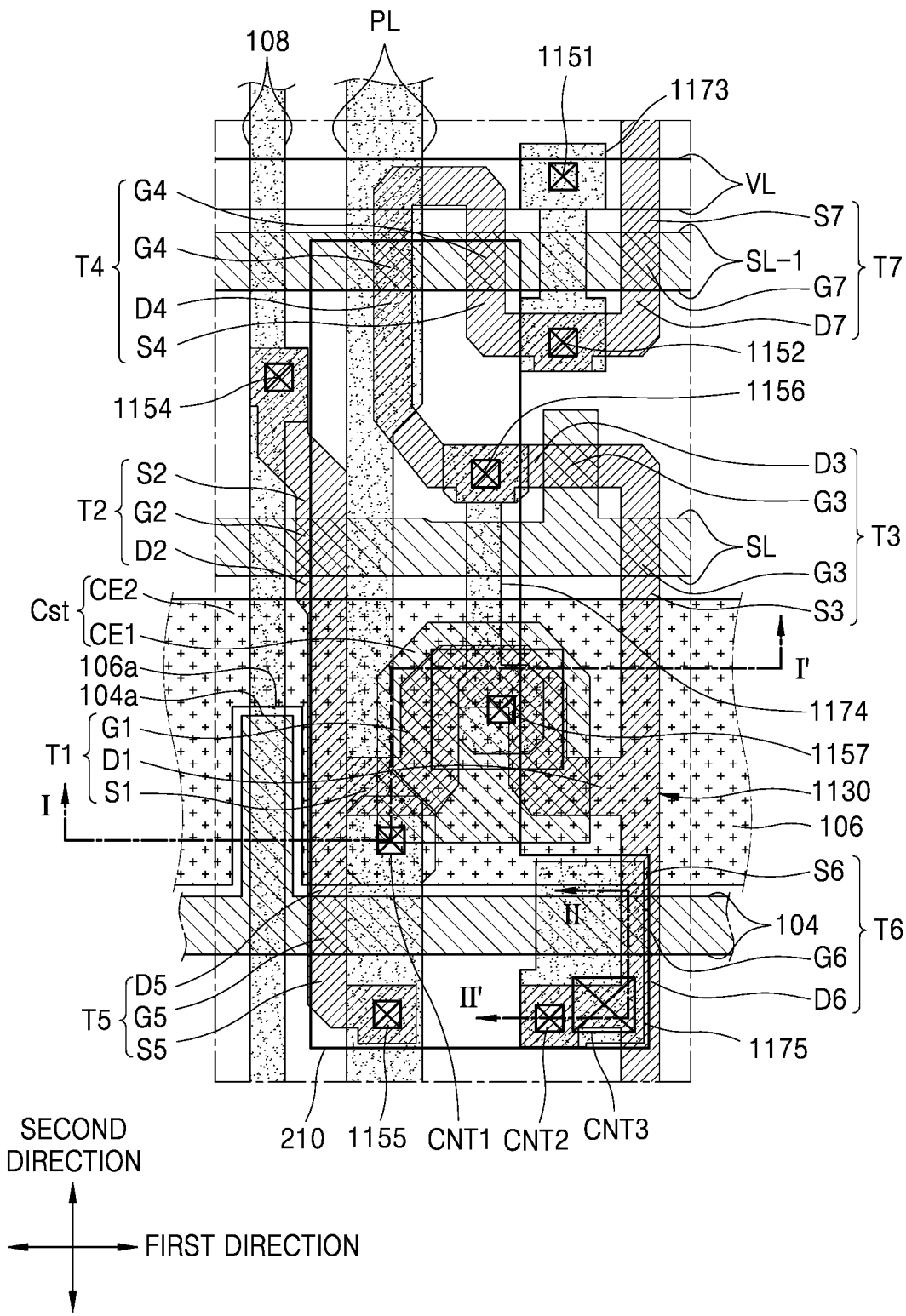
FIG. 5 is an arrangement view of a pixel circuit of a pixel according to one or more embodiments.
Figure 6:
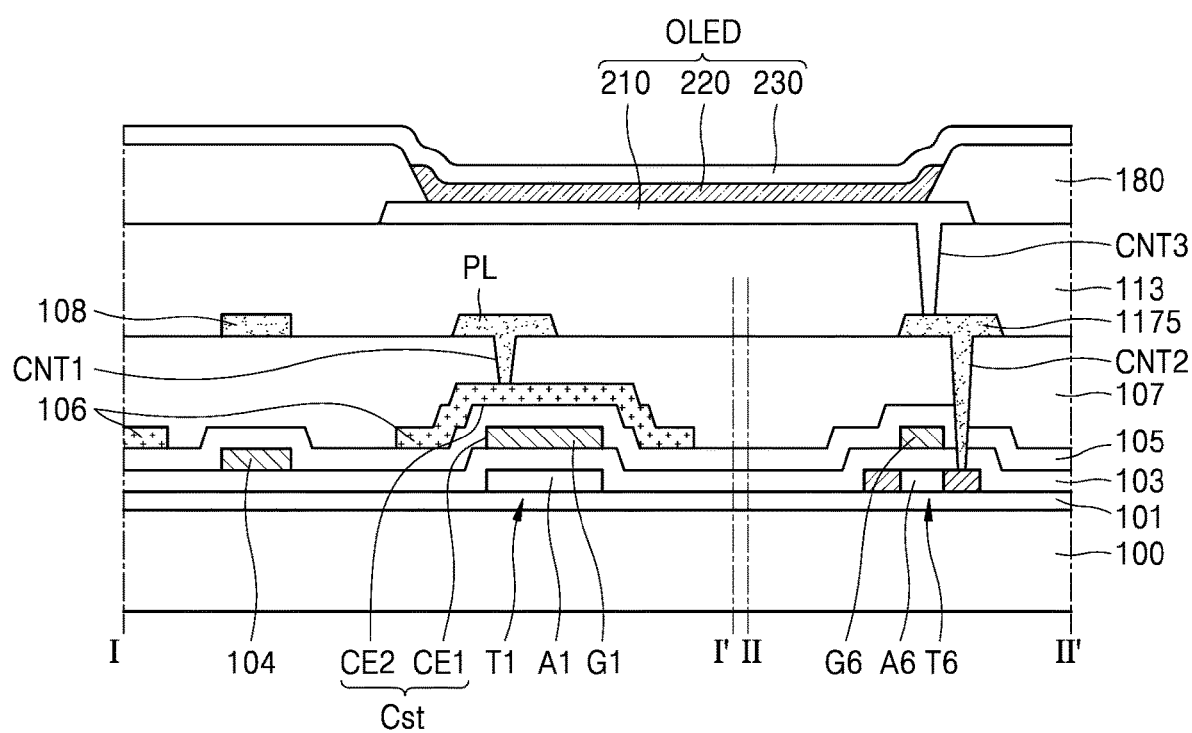
FIG. 6 is a cross-sectional view of the pixel circuit taken along the lines I-I' and II-II' of FIG. 5.

FIG. 5 is an arrangement view of a pixel circuit of a pixel according to one or more embodiments, and FIG. 6 is a cross-sectional view of the pixel circuit taken along the lines I-I' and II-II' of FIG. 5. Here, a first conductive layer 104 may be the emission control line EL, a second conductive layer 106 may be the electrode voltage line HL, and a third conductive layer 108 may be the data line DL.

Referring to FIG. 5, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along a semiconductor layer 1130.

The semiconductor layer 1130 is arranged over a substrate on which a buffer layer is formed, the buffer layer including an inorganic insulating material. In some embodiments, the semiconductor layer 1130 may include low temperature polycrystalline silicon (LTPS). Because polycrystalline silicon has high electron mobility (e.g., 100 cm$^2$/Vs or more), low power consumption, and excellent reliability, the polycrystalline silicon may be used as a semiconductor layer of a thin film transistor in a display device. However, the present disclosure is not limited thereto. In one or more embodiments, the semiconductor layer 1130 may include amorphous silicon (a-Si) and/or an oxide semiconductor. Some semiconductor layers of a plurality of thin film transistors may include LTPS, and other semiconductor layers may include a-Si and/or an oxide semiconductor.

Some regions of the semiconductor layer 1130 may correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be connected to each other, and may have a shape bent in various directions.

The semiconductor layer 1130 may include a channel region, a source region, and a drain region, the source region and the drain region being respectively on opposite sides of the channel region. It may be understood that the source region and the drain region are respectively a source electrode(s) and a drain electrode(s). Hereinafter, for convenience of description, a source region and a drain region are respectively referred to as a source electrode and a drain electrode.

The driving thin film transistor T1 includes the driving gate electrode G1, the driving source electrode S1, and the driving drain electrode D1, the driving gate electrode G1 overlapping a driving channel region, and the driving source electrode S1 and the driving drain electrode D1 being respectively on opposite sides of the driving channel region. The driving channel region overlapping the driving gate electrode G1 may form a long channel length in a narrow space by having a structure bent in various shapes. In the case where a length of the driving channel region is long, a driving range of a gate voltage widens, and gradation of light emitted from an organic light-emitting diode OLED may be more elaborately or precisely controlled, and accordingly, display quality may be improved.

The switching thin film transistor T2 includes the switching gate electrode G2, the switching source electrode S2, and the switching drain electrode D2, the switching gate electrode G2 overlapping a switching channel region, and the switching source electrode S2 and the switching drain electrode D2 being respectively on opposite sides of the switching channel region. The switching drain electrode D2 may be connected to the driving source electrode S1.

The compensation thin film transistor T3 is a dual thin film transistor, and may include the compensation gate electrodes G3, the compensation source electrode S3, and the compensation drain electrode D3, the compensation gate electrodes G3 overlapping two compensation channel regions, and the compensation source electrode S3 and the compensation drain electrode D3 being respectively on opposite sides of the compensation channel region. The compensation thin film transistor T3 may be connected to the driving gate electrode G1 of the driving thin film transistor T1 through a node connection line 1174 described below.

The first initialization thin film transistor T4 is a dual thin film transistor and may include the first initialization gate electrodes G4, the first initialization source electrode S4, and the first initialization drain electrode D4, the first initialization gate electrodes G4 overlapping two first initialization channel regions, and the first initialization source electrode S4 and the first initialization drain electrode D4 being respectively on opposite sides of the first initialization channel region.

The operation control thin film transistor T5 may include the operation control gate electrode G5, the operation control source electrode S5, and the operation control drain electrode D5, the operation control gate electrode G5 overlapping an operation control channel region, and the operation control source electrode S5 and the operation control drain electrode D5 being respectively on opposite sides of the operation control channel region. The operation control drain electrode D5 may be connected to the driving source electrode S1.

The emission control thin film transistor T6 may include the emission control gate electrode G6, the emission control source electrode S6, and the emission control drain electrode D6, the emission control gate electrode G6 overlapping an emission control channel region, and the emission control source electrode S6 and the emission control drain electrode D6 being respectively on opposite sides of the emission control channel region. The emission control source electrode S6 may be connected to the driving drain electrode D1.

The second initialization thin film transistor T7 may include the second initialization gate electrode G7, the second initialization source electrode S7, and the second initialization drain electrode D7, the second initialization gate electrode G7 overlapping a second initialization channel region, and the second initialization source electrode S7 and the second initialization drain electrode D7 being respectively on opposite sides of the second initialization channel region.

The above-described thin film transistors may be connected to the signal lines SL and SL−1, the first conductive layer 104, the third conductive layer 108, the initialization voltage line VL, and the driving voltage line PL.

The scan line SL, the previous scan line SL−1, the first conductive layer 104, and the driving gate electrode G1 may be arranged over the semiconductor layer 1130 with an insulating layer(s) therebetween.

The scan line SL may extend in the first direction. Some regions of the scan line SL may respectively correspond to the switching and compensation gate electrodes G2 and G3. For example, regions of the scan line SL that overlap the switching and compensation thin film transistors T2 and T3 may be the switching and compensation gate electrodes G2 and G3, respectively.

The previous scan line SL−1 may extend in the first direction, and some regions of the previous scan line SL−1 may respectively correspond to the first and second initialization gate electrodes G4 and G7. For example, regions of the previous scan line SL−1 that overlap the channel regions of the first and second initialization thin film transistors T4 and T7 may be the first and second initialization gate electrodes G4 and G7, respectively.

The first conductive layer 104 may extend in the first direction and include a protrusion 104a protruding in the second direction that perpendicularly intersects with the first direction. Some regions of the first conductive layer 104 may respectively correspond to the operation control and emission control gate electrodes G5 and G6. For example, regions of the first conductive layer 104 that overlap the channel regions of the operation control and emission control thin film transistors T6 and T7 may be the operation control and emission control gate electrodes G5 and G6, respectively.

The driving gate electrode G1 is a floating electrode and may be connected to the compensation thin film transistor T3 through the node connection line 1174.

The second conductive layer 106 may be arranged over the scan line SL, the previous scan line SL−1, the first conductive layer 104, and the driving gate electrode G1 with an insulating layer(s) therebetween.

The second conductive layer 106 may extend in the first direction so as to intersect with the third conductive layer 108 and the driving voltage line PL described below, and may include a groove 106a corresponding to (e.g., partially surrounding) the protrusion 104a. A portion of the second conductive layer 106 may cover at least a portion of the driving gate electrode G1, and may constitute the storage capacitor Cst in cooperation with the driving gate electrode G1. For example, the driving gate electrode G1 may serve as a bottom electrode CE1 of the storage capacitor Cst, and a portion of the second conductive layer 106 may serve as a top electrode CE2 of the storage capacitor Cst.

The top electrode CE2 of the storage capacitor Cst is electrically connected to the driving voltage line PL. With regard to this, the second conductive layer 106 may be connected to the driving voltage line PL arranged over the second conductive layer 106 through a first contact hole CNT1. Therefore, the second conductive layer 106 may have the same voltage level (a constant voltage) as that of the driving voltage line PL. For example, the second conductive layer 106 may have a constant voltage of +5V. It may be understood that the second conductive layer 106 is a driving voltage line in a transverse direction.

Because the driving voltage line PL extends in the second direction, and because the second conductive layer 106 electrically connected to the driving voltage line PL extends in the first direction intersecting with the second direction, a plurality of driving voltage lines PL and second conductive layers 106 may constitute a mesh structure in the display area DA.

The third conductive layer 108, the driving voltage line PL, an initialization connection line 1173, and the node connection line 1174 may be arranged over the second conductive layer 106 with an insulating layer(s) therebetween.

The third conductive layer 108 may extend in the second direction, and may overlap the protrusion 104a of the first conductive layer 104. For example, the protrusion 104a of the first conductive layer 104 that protrudes in the second direction may overlap the third conductive layer 108, and may serve as a shield electrode for reducing or preventing influence of the third conductive layer 108 on other wirings. The third conductive layer 108 may be connected to the switching source electrode S2 of the switching thin film transistor T2 through a contact hole 1154. A portion of the third conductive layer 108 may be the switching source electrode S2.

The driving voltage line PL may extend in the second direction, and may be connected to the second conductive layer 106 through the first contact hole CNT1 as described above. Also, the driving voltage line PL may be connected to the operation control thin film transistor T5 through a contact hole 1155. The driving voltage line PL may be connected to the operation control source electrode S5 through the contact hole 1155.

One end of the initialization connection line 1173 may be connected to the first and second initialization thin film transistors T4 and T7 through a contact hole 1152, and the other end of the initialization connection line 1173 may be connected to the initialization voltage line VL through a contact hole 1151.

One end of the node connection line 1174 may be connected to the compensation drain electrode D3 through a contact hole 1156, and the other end of the node connection line 1174 may be connected to the driving gate electrode G1 through a contact hole 1157.

The initialization voltage line VL may be arranged over the third conductive layer 108, the driving voltage line PL, the initialization connection line 1173, and the node connection line 1174 with an insulating layer(s) therebetween.

The initialization voltage line VL may extend in the first direction, and may be connected to the first and second initialization driving thin film transistors T4 and T7 through the initialization connection line 1173. The initialization voltage line VL may have a constant voltage (e.g., −2V).

The initialization voltage line VL may be arranged on the same layer as a layer on which the pixel electrode 210 of the organic light-emitting diode OLED (see FIG. 6) is arranged, and may include the same material as that of the pixel electrode 210. The pixel electrode 210 may be connected to the emission control thin film transistor T6. The pixel electrode 210 may be connected to a connection metal 1175 through a third contact hole CNT3, and the connection metal 1175 may be connected to the emission control drain electrode D6 through the second contact hole CNT2.

Though it is shown in FIG. 5 that the initialization voltage line VL is arranged on the same layer as a layer on which the pixel electrode 210 is arranged, the initialization voltage line VL may be arranged on the same layer as a layer on which the second conductive layer 106 is arranged in other embodiments.

Hereinafter, a structure of the display device 1 according to one or more embodiments is described according to a stacking sequence. In FIG. 6, structures of the driving thin film transistor T1, the emission control thin film transistor T6, and the storage capacitor Cst are mainly described, and some members may be omitted.

The display device 1 according to one or more embodiments includes a substrate 100, a first thin film transistor including a first semiconductor layer and a first gate electrode, a second thin film transistor including a second semiconductor layer and a second gate electrode, a storage capacitor including a bottom electrode and a top electrode, the first conductive layer 104, the second conductive layer 106, and the third conductive layer 108. The first thin film transistor may be the driving thin film transistor T1, the second thin film transistor may be the emission control thin film transistor T6, the first semiconductor layer may be a semiconductor layer A1 of the driving thin film transistor T1, the second semiconductor layer may be a semiconductor layer A6 of the emission control thin film transistor T6, the first gate electrode may be the gate electrode G1 of the driving thin film transistor T1, and the second gate electrode may be the gate electrode G6 of the emission control thin film transistor T6.

Also, the display device 1 may further include various insulating layers including a buffer layer 101, a gate insulating layer 103, a first insulating layer 105, a second insulating layer 107, and a planarization layer 113.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 including the polymer resin may be flexible, rollable, or bendable. In some embodiments, the substrate 100 may have a multi-layered structure including a layer including the above polymer resin and an inorganic layer.

The buffer layer 101 is located on the substrate 100, may reduce or block the penetration of foreign substances, moisture, or external air from below the substrate 100, and may provide a flat surface on the substrate 100. The buffer layer 101 may include an inorganic material, such as an oxide or a nitride, an organic material, or an organic/inorganic composite material, and may include a single layer or a multi-layer including an inorganic material and an organic material. In some embodiments, a barrier layer blocking the penetration of external air may be further arranged between the substrate 100 and the buffer layer 101.

The semiconductor layers A1 and A6 are arranged on the buffer layer 101, and the gate electrodes G1 and G6 are respectively arranged over the semiconductor layers A1 and A6 with the gate insulating layer 103 therebetween. The gate electrodes G1 and G6 may include a single layer or a multi-layer including at least one of molybdenum (Mo), aluminum (Al), copper (Cu), and/or titanium (Ti). In one or more embodiments, the gate electrodes G1 and G6 may be single Mo layers. The scan line SL (see FIG. 5), the previous scan line SL−1, and the first conductive layer 104 may be arranged on the same layer as a layer on which the gate electrodes G1 and G6 are arranged. That is, the gate electrodes G1 and G6, the scan line SL (see FIG. 5), the previous scan line SL−1, and the first conductive layer 104 may be arranged on the gate insulating layer 103. In one or more embodiments, the first conductive layer 104 may include the first gate electrode or the second gate electrode. For example, the first conductive layer 104 may include the gate electrode G1 of the driving thin film transistor T1 or the gate electrode G6 of the emission control thin film transistor T6.

The gate insulating layer 103 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The first insulating layer 105 may cover the gate electrodes G1 and G6. The first insulating layer 105 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The bottom electrode CE1 of the storage capacitor Cst may be provided as one body with the gate electrode G1 of the driving thin film transistor T1. For example, the gate electrode G1 of the driving thin film transistor T1 may serve as the bottom electrode CE1 of the storage capacitor Cst.

The top electrode CE2 of the storage capacitor Cst overlaps the bottom electrode CE1 with the first insulating layer 105 therebetween. In this case, the first insulating layer 105 may serve as a dielectric layer of the storage capacitor Cst. The top electrode CE2 may include a single layer or a multi-layer including a conductive material including molybdenum (Mo), aluminum (Al), copper (Cu), and titanium (Ti). For example, the top electrode CE2 may include a single Mo or a multi-layer of Mo/Al/Mo. For example, the top electrode CE2 may include the same material as that of the second conductive layer 106.

Though it is shown in FIG. 6 that the storage capacitor Cst overlaps the driving thin film transistor T1, other embodiments are not limited thereto. For example, the storage capacitor Cst might not overlap the driving thin film transistor T1. Various modifications may be made.

The top electrode CE2 may serve as the second conductive layer 106. For example, a portion of the second conductive layer 106 may serve as the top electrode CE2 of the storage capacitor Cst.

The second insulating layer 107 may cover the top electrode CE2. The second insulating layer 107 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). Though it is shown in FIG. 6 that the second insulating layer 107 includes a single layer, the second insulating layer 107 may include a multi-layered structure.

The third conductive layer 108, the driving voltage line PL, and the connection metal 1175 may be arranged on the second insulating layer 107. The third conductive layer 108, the driving voltage line PL, and the connection metal 1175 may include a single layer or a multi-layer including a conductive material including molybdenum (Mo), aluminum (Al), copper (Cu), and/or titanium (Ti). For example, the third conductive layer 108, the driving voltage line PL, and the connection metal 1175 may include a multi-layered structure of Ti/Al/Ti.

The top electrode CE2 of the storage capacitor Cst may be connected to the driving voltage line PL through the first contact hole CNT1 defined in the second insulating layer 107. This may mean that the second conductive layer 106 may be connected to the driving voltage line PL through the first contact hole CNT1. Therefore, the second conductive layer 106 may have the same voltage level (a constant voltage) as that of the driving voltage line PL.

The connection metal 1175 may be connected to the semiconductor layer A6 of the emission control thin film transistor T6 through the second contact hole CNT2 passing through the second insulating layer 107 and the gate insulating layer 103. The emission control thin film transistor T6 may be electrically connected to the pixel electrode 210 of the organic light-emitting diode OLED through the connection metal 1175.

The planarization layer 113 is located on the third conductive layer 108, the driving voltage line PL, and the connection metal 1175. The organic light-emitting diode OLED is located on the planarization layer 113.

The planarization layer 113 may be arranged on the second insulating layer 107. The planarization layer 113 planarizes a top surface of the pixel circuit PC to planarize a surface on which the organic light-emitting diode OLED is to be located.

The planarization layer 113 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof. The planarization layer 113 may include an inorganic material. The planarization layer 113 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). In the case where the planarization layer 113 includes the inorganic material, chemical planarization polishing may be performed depending on a case. The planarization layer 113 may include both an organic material and an inorganic material.

The pixel electrode 210 may be arranged on the planarization layer 113. The pixel electrode 210 may include a (semi) transparent electrode or a reflective electrode. In one or more embodiments, the pixel electrode 210 may include a reflective layer and a transparent or semi-transparent electrode layer on the reflective layer, the reflective layer including silver (Ag), magnesium (Mg), aluminum (Al), platinum (Pt), palladium (Pd), gold (Au), nickel (Ni), neodymium (Nd), iridium (Ir), chrome (Cr), and/or a compound thereof. The transparent or semi-transparent electrode layer may include at least one of indium tin oxide (ITO), indium zinc oxide (IZO), zinc oxide (ZnO), indium oxide ($In_2O_3$), indium gallium oxide (IGO), and/or aluminum zinc oxide (AZO). In one or more embodiments, the pixel electrode 210 may have a stacked structure of ITO/Ag/ITO.

A pixel-defining layer 180 may be arranged on the planarization layer 113. The pixel-defining layer 180 may define an emission area of a pixel by including an opening exposing a central portion of the pixel electrode 210. Also, the pixel-defining layer 180 may prevent an arc, etc. from occurring at edges of the pixel electrode 210 by increasing a distance between the edges of the pixel electrode 210 and the opposite electrode 230 over the pixel electrode 210. The pixel-defining layer 180 may include an organic insulating material such as polyimide, polyamide, an acrylic resin, BCB, HMDSO, and a phenolic resin. The pixel-defining layer 180 may be formed by a method such as spin coating.

In some embodiments, a spacer may be arranged on the pixel-defining layer 180. The spacer may prevent the organic light-emitting diode OLED from being damaged by sagging of a mask during a manufacturing process that uses the mask. The spacer may include a single layer or a multi-layer including an organic insulating material such as polyimide, polyamide, an acrylic resin, BCB, HMDSO, and a phenolic resin. The spacer may be formed by a method such as spin coating.

An intermediate layer 220 may be arranged on a portion of the pixel electrode 210 that is exposed by the pixel-defining layer 180. The intermediate layer 220 may include an emission layer and further include functional layers under and on the emission layer, the functional layers including a hole transport layer (HTL), a hole injection layer (HIL), an electron transport layer (ETL), and an electron injection layer (EIL).

The emission layer may include an organic material including a fluorescent or phosphorous material emitting red, green, blue, or white light. The emission layer may include a low molecular weight organic material and/or a polymer organic material.

In the case where the emission layer includes a low molecular weight material, the intermediate layer 220 may have a structure in which an HIL, an HTL, an emission layer (EML), an ETL, an EIL, etc. are stacked in a single or a composite configuration. The intermediate layer 220 may include, as a low molecular weight material, various organic materials such as copper phthalocyanine (CuPc), N, N'-Di (naphthalene-1-yl)-N, N'-diphenyl-benzidine (NPB), and/or tris-8-hydroxyquinoline aluminum (Alq3). These layers may be formed by vacuum deposition.

In the case where the emission layer includes a polymer material, the intermediate layer 220 may have a structure generally including an HTL and an EML. In this case, the HTL may include poly(3,4-ethylenedioxythiophene) (PEDOT), and the EML may include a polymer material such as a polyphenylene vinylene (PPV)-based material and a polyfluorene-based material. The emission layer may be formed by screen printing, inkjet printing, laser induced thermal imaging (LITI), etc.

The pixel electrode 210 may be provided as a plurality of pixel electrodes, and the intermediate layer 220 may be arranged to respectively correspond to the plurality of pixel electrodes 210. However, other embodiments are not limited thereto. The intermediate layer 220 may include a layer that is one body over the plurality of pixel electrodes 210. Various modifications may be made. In one or more embodiments, the intermediate layer 220 may be arranged to respectively correspond to the plurality of pixel electrodes 210, and the functional layer(s) except for the intermediate layer 220 may be provided as one body over the plurality of pixel electrodes 210.

The opposite electrode 230 may be arranged on the intermediate layer 220. The opposite electrode 230 may be arranged on the intermediate layer 220, and may entirely cover the intermediate layer 220.

The opposite electrode 230 may be arranged in the display area DA and arranged on an entire surface of the display area DA. That is, the opposite electrode 230 may be provided as one body so as to cover the plurality of pixels.

The opposite electrode 230 may include a transparent electrode or a reflective electrode. In one or more embodiments, the opposite electrode 230 may be a transparent or semi-transparent electrode, and may include a metal thin layer having a small work function and including at least one of lithium (Li), calcium (Ca), lithium fluoride (LiF)/Ca, LiF/aluminum (Al), Al, silver (Ag), magnesium (Mg), and/or a compound thereof. Also, a transparent conductive oxide (TCO) layer may be further arranged on the metal thin layer, the TCO layer including ITO, IZO, ZnO, and/or $In_2O_3$.

In the case where the pixel electrode 210 includes a reflective electrode and the opposite electrode 230 includes a transparent electrode, light emitted from the intermediate layer 220 is emitted toward the opposite electrode 230, and thus the display device 1 may be a top-emission type display device.

In one or more embodiments, in the case where the pixel electrode 210 includes a transparent or semi-transparent electrode, and where the opposite electrode 230 includes a reflective electrode, light emitted from the intermediate layer 220 is emitted toward the substrate 100, and thus the display device 1 may be a bottom-emission type display device. However, the embodiments are not limited thereto, and the display device 1 may be a dual-emission type display device that emits light in two directions including a top side and a bottom side of the display device 1.

Figure 7:
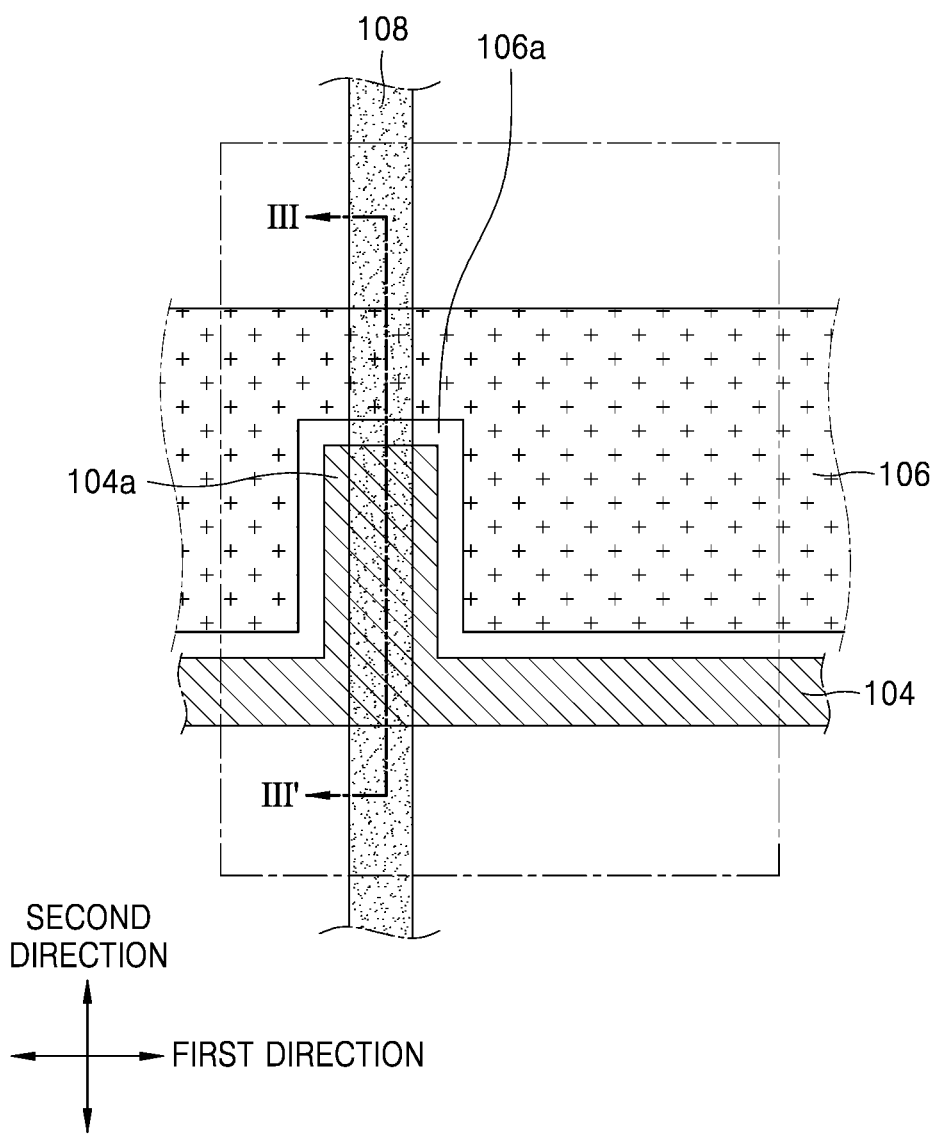
FIG. 7 is an arrangement view of only a portion of a configuration of FIG. 5 in a display device according to one or more embodiments.
Figure 8:
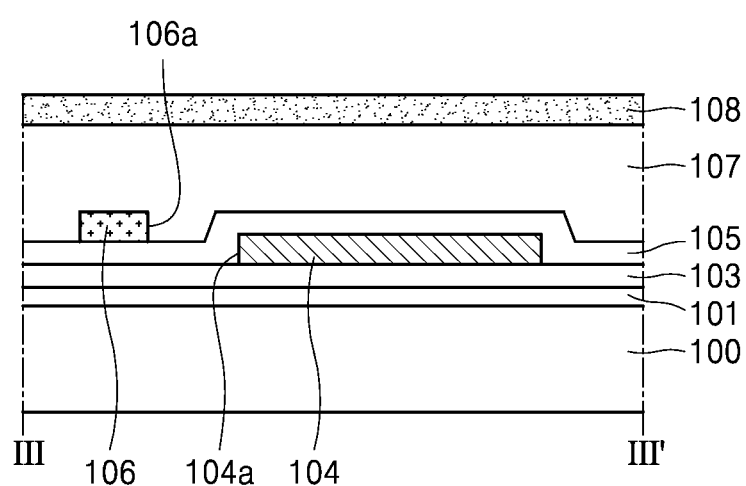
FIG. 8 is a cross-sectional view taken along the line III-III' of FIG. 7.
Figure 9:
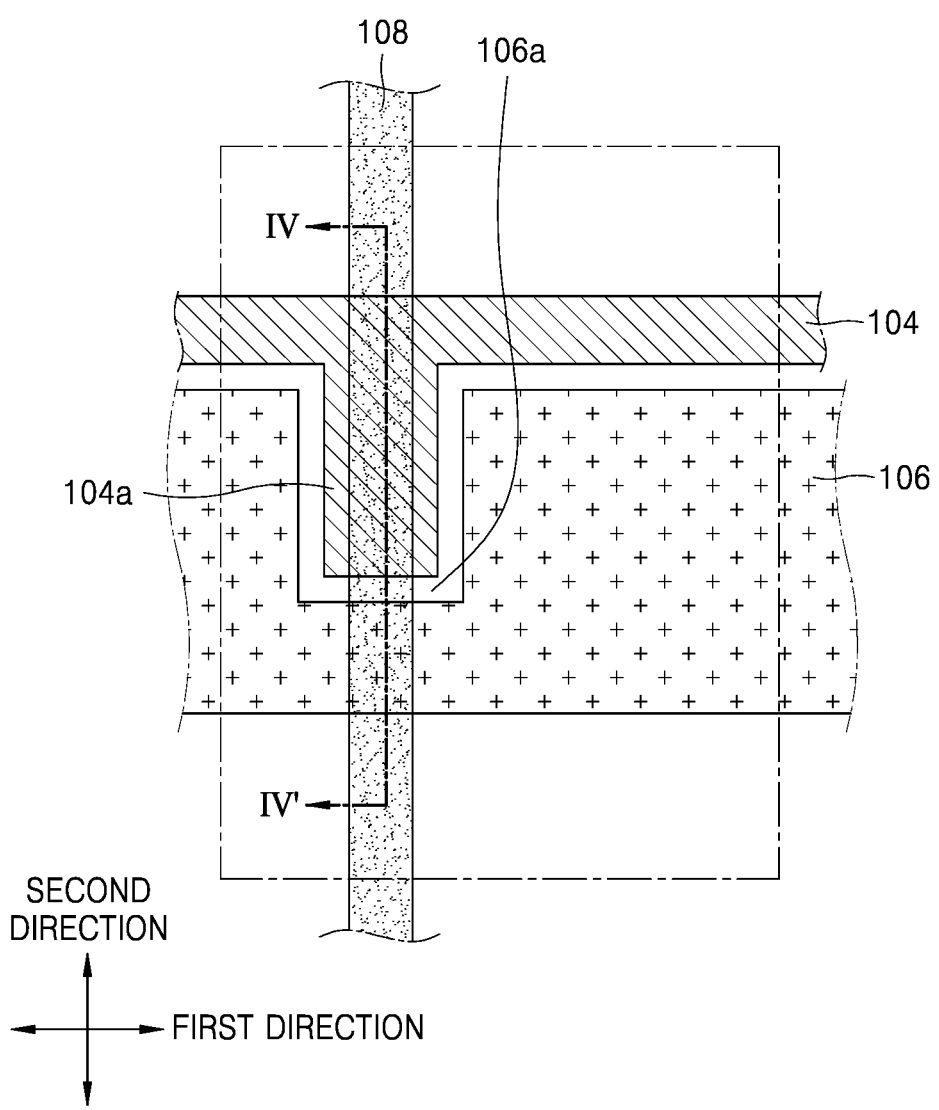
FIG. 9 is an arrangement view of only a portion of a configuration of FIG. 5 in a display device according to one or more embodiments.
Figure 10:
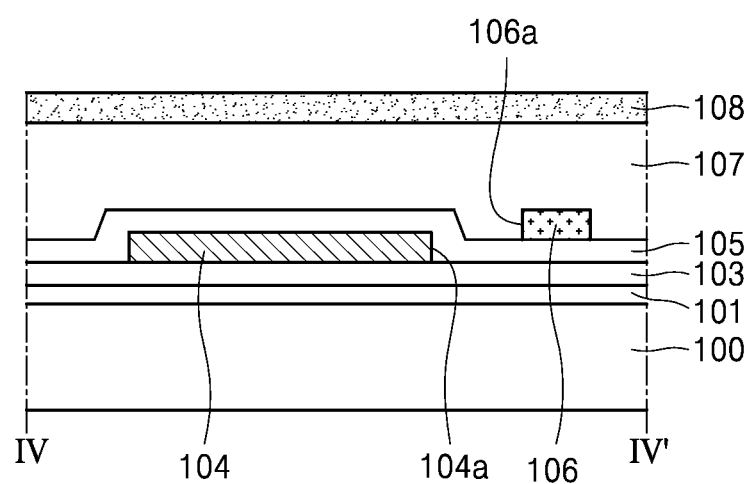
FIG. 10 is a cross-sectional view taken along the line IV-IV' of FIG. 9.

FIG. 7 is an arrangement view of only a portion of a configuration of FIG. 5 in the display device 1 according to one or more embodiments, FIG. 8 is a cross-sectional view taken along the line III-III' of FIG. 7, FIG. 9 is an arrangement view of only a portion of a configuration of FIG. 5 in the display device 1 according to one or more embodiments, and FIG. 10 is a cross-sectional view taken along the line IV-IV' of FIG. 9.

In FIGS. 7 and 9, like FIG. 5, the driving thin film transistor T1, the switching thin film transistor T2, the compensation thin film transistor T3, the first initialization thin film transistor T4, the operation control thin film transistor T5, the emission control thin film transistor T6, the second initialization thin film transistor T7, the scan line SL, the previous scan line SL−1, the storage capacitor Cst, the driving voltage line PL, the initialization connection line 1173, the node connection line 1174, and the initialization voltage line VL may be arranged. For convenience of description, the elements are briefly shown in FIGS. 7 and 9.

Referring to FIGS. 7 to 10, the first conductive layer 104 may be arranged on the gate insulating layer 103 of the display device 1 according to one or more embodiments. The first conductive layer 104 may extend in the first direction on a plane, may be arranged in the display area DA, and have the protrusion 104a protruding in the second direction that perpendicularly intersects with the first direction.

The first insulating layer 105 may be arranged on the first conductive layer 104, and the second conductive layer 106 may be arranged on the first insulating layer 105. The second conductive layer 106 may extend in the first direction on a plane, may be arranged on the first insulating layer 105, and may have the groove 106a corresponding to the protrusion 104a of the first conductive layer 104. The groove 106a of the second conductive layer 106 may be apart from the protrusion 104a of the first conductive layer 104 in the first direction and the second direction.

The second insulating layer 107 may be arranged on the second conductive layer 106, and the third conductive layer 108 may be arranged on the second insulating layer 107. The third conductive layer 108 may extend in the second direction on a plane, may be arranged on the second insulating layer 107, and may overlap the protrusion 104a of the first conductive layer 104. Also, the third conductive layer 108 may overlap at least a portion of the second conductive layer 106.

Line crosstalk may be prevented from being viewed or noticed during high-speed driving by reducing a section in which the second conductive layer 106 overlaps the third conductive layer 108, and may thus reduce a capacitance of a storage capacitor formed between the second conductive layer 106 and the third conductive layer 108. Because the first conductive layer 104 overlaps the third conductive layer 108, and thus the first conductive layer 104 serves as a shield electrode, visibility of plane crosstalk may be reduced or prevented.

Figure 11:
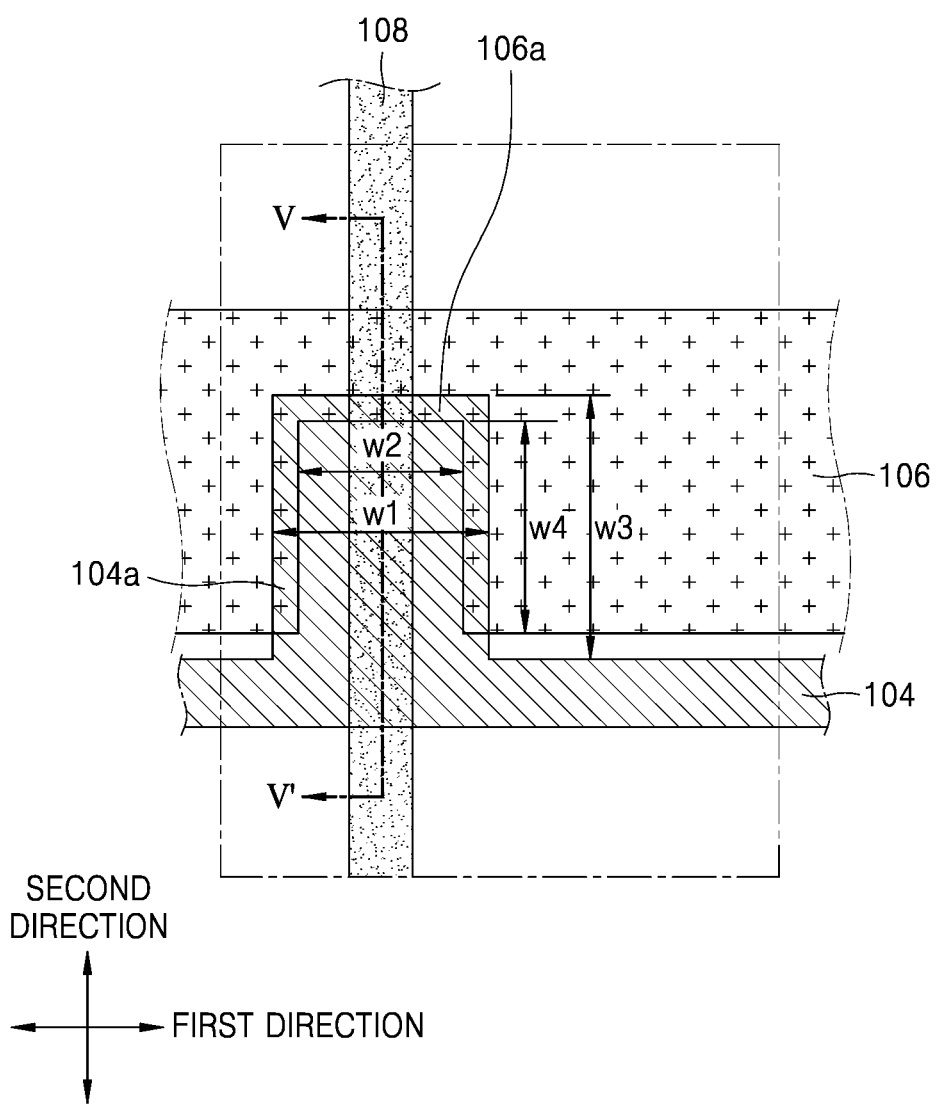
FIG. 11 is an arrangement view of only a portion of a configuration of FIG. 5 in a display device according to one or more embodiments.
Figure 12:
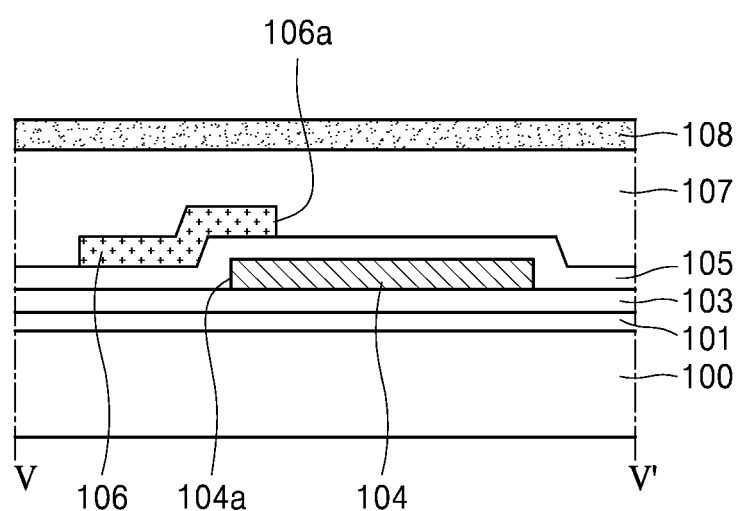
FIG. 12 is a cross-sectional view taken along the line V-V' of FIG. 11.

FIG. 11 is an arrangement view of only a portion of a configuration of FIG. 5 in the display device 1 according to one or more embodiments, and FIG. 12 is a cross-sectional view taken along the line V-V' of FIG. 11.

In FIG. 11, like FIG. 5, the driving thin film transistor T1, the switching thin film transistor T2, the compensation thin film transistor T3, the first initialization thin film transistor T4, the operation control thin film transistor T5, the emission control thin film transistor T6, the second initialization thin film transistor T7, the scan line SL, the previous scan line SL−1, the storage capacitor Cst, the driving voltage line PL, the initialization connection line 1173, the node connection line 1174, and the initialization voltage line VL may be arranged. For convenience of description, the elements are briefly shown in FIG. 11.

Referring to FIGS. 11 and 12, a width of the protrusion 104a of the first conductive layer 104 of the display device 1 in the first direction, according to one or more embodiments, may be greater than a width of the groove 106a of the second conductive layer 106 in the first direction. For example, the protrusion 104a of the first conductive layer 104 may have a first width w1 in the first direction, and the groove 106a of the second conductive layer 106 may have a second width w2 that is in the first direction and that is less than the first width w1. Therefore, the protrusion 104a of the first conductive layer 104 may overlap at least a portion of the second conductive layer 106 in the first direction.

A width, or length, of the protrusion 104a of the first conductive layer 104 in the second direction may be greater than a width, or length, of the groove 106a of the second conductive layer 106 in the second direction. For example, the protrusion 104a of the first conductive layer 104 may have a third width w3 in the second direction, and the groove 106a of the second conductive layer 106 may have a fourth width w4 that is in the second direction and that is less than the third width w3. Therefore, the protrusion 104a of the first conductive layer 104 may overlap at least a portion of the second conductive layer 106 in the second direction.

Because the protrusion 104a of the first conductive layer 104 overlaps at least a portion of the second conductive layer 106, the protrusion 104a of the first conductive layer 104 may serve as a bridge electrode electrically connecting portions of the second conductive layer 106 that are spaced apart from each other with the groove 106a of the second conductive layer 106 therebetween.

In one or more embodiments, the second conductive layer 106 might not include the groove 106a, and portions thereof may be spaced apart from each other with the third conductive layer 108 therebetween when viewed on a plane. The portions of the second conductive layer 106 that are spaced apart from each other with the third conductive layer 108 therebetween may partially overlap each other. Because the portions of the second conductive layer 106 that are spaced apart from each other with the third conductive layer 108 therebetween overlap at least a portion of the first conductive layer 104, the first conductive layer 104 may serve as a bridge electrode electrically connecting the portions of the second conductive layer 106 that are apart from each other.

The display device 1 according to one or more embodiments includes the substrate 100 including the display area DA in which display elements are arranged, the emission control line 104 extending in the first direction on a plane and including the protrusion 104a protruding in the second direction that intersects with the first direction, the first insulating layer 105 arranged on the emission control line 104, the electrode voltage line 106 extending in the first direction on a plane, arranged on the first insulating layer 105, and including the groove 106a, which may be spaced apart from the protrusion 104a of the emission control line 104 in the first direction and the second direction, the data line 108 extending in the second direction on a plane, arranged on the electrode voltage line 106, and shielded by the protrusion 104a of the emission control line 104, and the second insulating layer 107 arranged between the electrode voltage line 106 and the data line 108.

In the case where a display device according to the related art is driven in high speed, line crosstalk may be viewed due to a capacitance formed between the electrode voltage line 106 and the data line 108. To resolve the above issue, one or more embodiments may prevent line crosstalk that is otherwise visible due to a capacitance formed between the electrode voltage line 106 and the data line 108 by reducing a section in which the electrode voltage line 106 overlaps the data line 108. In one or more embodiments, the electrode voltage line 106 may overlap at least a portion of the data line 108.

Also, in the case where a section in which the electrode voltage line 106 overlaps the data line 108 is reduced, plane crosstalk may be viewed due to the data line 108 beings floated. Therefore, the disclosed embodiments may prevent plane crosstalk from being viewed by reducing a section in which the electrode voltage line 106 overlaps the data line 108, and by shielding the data line 108 with the emission control line 104.

In one or more embodiments, the first thin film transistor arranged in the display area and including the first semiconductor layer, and the first gate electrode that is insulated from the first semiconductor layer, and the second thin film transistor arranged in the display area and including the second semiconductor layer, and the second gate electrode that is insulated from the second semiconductor layer, may be further included, wherein the first thin film transistor may be the driving thin film transistor T1, the second thin film transistor may be the emission control thin film transistor T6, the first semiconductor layer may be the semiconductor layer A1 of the driving thin film transistor T1, the second semiconductor layer may be the semiconductor layer A6 of the emission control thin film transistor T6, the first gate electrode may be the gate electrode G1 of the driving thin film transistor T1, and the second gate electrode may be the gate electrode G6 of the emission control thin film transistor T6.

The first gate electrode and the second gate electrode may be arranged on the same layer as a layer on which the emission control line 104 is arranged. In one or more embodiments, the emission control line 104 may include the first gate electrode or the second gate electrode. The first conductive layer 104 may include the first gate electrode and the second gate electrode. For example, the first conductive layer 104 may include the gate electrode G1 of the driving thin film transistor T1 or the gate electrode G6 of the emission control thin film transistor T6.

The storage capacitor including the bottom electrode and the top electrode may be further provided, the bottom electrode including the same material as that of the first gate electrode, and the top electrode including the same material as that of the electrode voltage line 106.

To resolve an issue in which crosstalk is viewed while a display device according to the related art is driven in high speed, embodiments disclosed herein may provide a display device that reduces or prevents visibility of crosstalk, and that has an improved reliability by reducing a section in which an electrode voltage line overlaps a data line, and by allowing an emission control line to overlap the data line.

Up to now, though only the display device has been mainly described, the present disclosure is not limited thereto. For example, a method of manufacturing the display device also belongs to the scope of the present disclosure.

An embodiment may provide a display device that reduces or prevents crosstalk visibility during high-speed driving, and that also has an improved reliability by reducing a section in which the second conductive layer overlaps the third conductive layer and by allowing the first conductive layer to overlap the third conductive layer. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display device comprising:
 a substrate comprising a display area in which a display element is arranged;
 a first conductive layer extending in a first direction on a plane, located in the display area, and comprising a protrusion protruding in a second direction crossing the first direction;
 a first insulating layer on the first conductive layer;
 a second conductive layer extending in the first direction on a plane, located on the first insulating layer, and defining a groove overlapping the protrusion of the first conductive layer;
 a second insulating layer on the second conductive layer; and
 a third conductive layer extending in the second direction on a plane, located on the second insulating layer, and overlapping the protrusion of the first conductive layer.

2. The display device of claim 1, wherein the protrusion of the first conductive layer is apart from a first edge of the second conductive layer partially defining the groove of the second conductive layer in the first direction.

3. The display device of claim 2, wherein the protrusion of the first conductive layer is apart from a second edge of the second conductive layer partially defining the groove of the second conductive layer in the second direction.

4. The display device of claim 1, wherein a width of the protrusion of the first conductive layer in the first direction is greater than a width of the groove of the second conductive layer in the first direction.

5. The display device of claim 4, wherein the protrusion of the first conductive layer overlaps at least a portion of the second conductive layer in the first direction.

6. The display device of claim 1, wherein a length of the protrusion of the first conductive layer in the second direction is greater than a length of the groove of the second conductive layer in the second direction.

7. The display device of claim 6, wherein the protrusion of the first conductive layer overlaps at least a portion of the second conductive layer in the second direction.

8. The display device of claim 1, wherein the third conductive layer overlaps at least a portion of the second conductive layer.

9. The display device of claim 1, further comprising a first thin film transistor in the display area, the first thin film transistor comprising a first semiconductor layer, and a first gate electrode insulated from the first semiconductor layer.

10. The display device of claim 9, wherein the first gate electrode is on the same layer as the first conductive layer.

11. The display device of claim 9, further comprising a storage capacitor comprising a bottom electrode, and a top electrode over the bottom electrode,
wherein the bottom electrode comprises the same material as the first gate electrode, and
wherein the top electrode comprises the same material as the second conductive layer.

12. The display device of claim 1, further comprising a driving voltage line on the same layer as the third conductive layer,
wherein the driving voltage line is connected to the second conductive layer through a first contact hole.

13. The display device of claim 1, further comprising a second thin film transistor in the display area, the second thin film transistor comprising a second semiconductor layer, and a second gate electrode insulated from the second semiconductor layer.

14. The display device of claim 13, further comprising a connection metal on the second insulating layer,
wherein the connection metal is on the same layer as the third conductive layer.

15. A display device comprising:
a substrate comprising a display area in which a display element is arranged;
an emission control line extending in a first direction on a plane, located in the display area, and comprising a protrusion protruding in a second direction crossing the first direction;
a first insulating layer on the emission control line;
an electrode voltage line extending in the first direction on a plane, located on the first insulating layer, and defining a groove that is apart from the protrusion of the emission control line in the first direction and in the second direction;
a data line extending in the second direction on a plane, located on the electrode voltage line, and shielded by the protrusion of the emission control line; and
a second insulating layer between the electrode voltage line and the data line.

16. The display device of claim 15, wherein the data line overlaps at least a portion of the electrode voltage line.

17. The display device of claim 15, further comprising a first thin film transistor in the display area, the first thin film transistor comprising a first semiconductor layer, and a first gate electrode insulated from the first semiconductor layer.

18. The display device of claim 17, wherein the first gate electrode is on the same layer as the emission control line.

19. The display device of claim 17, further comprising a storage capacitor comprising a bottom electrode, and a top electrode over the bottom electrode,
wherein the bottom electrode comprises the same material as the first gate electrode, and
wherein the top electrode comprises the same material as the electrode voltage line.

20. The display device of claim 15, further comprising a second thin film transistor in the display area, the second thin film transistor comprising a second semiconductor layer, and a second gate electrode insulated from the second semiconductor layer.

* * * * *